(12) United States Patent
Xie et al.

(10) Patent No.: US 10,468,300 B2
(45) Date of Patent: Nov. 5, 2019

(54) CONTACTING SOURCE AND DRAIN OF A TRANSISTOR DEVICE

(71) Applicant: GLOBALFOUNDRIES Inc., Grand Cayman (KY)

(72) Inventors: Ruilong Xie, Niskayuna, NY (US); Andre Labonte, Mechanicville, NY (US); Lars Liebmann, Mechanicville, NY (US); Daniel Chanemougame, Niskayuna, NY (US); Chanro Park, Clifton Park, NY (US); Nigel Cave, Saratoga Springs, NY (US); Vimal Kamineni, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 18 days.

(21) Appl. No.: 15/641,927

(22) Filed: Jul. 5, 2017

(65) Prior Publication Data
US 2019/0013241 A1 Jan. 10, 2019

(51) Int. Cl.
| H01L 21/768 | (2006.01) |
| H01L 21/8234 | (2006.01) |
| H01L 21/285 | (2006.01) |
| H01L 21/311 | (2006.01) |
| H01L 27/088 | (2006.01) |

(Continued)

(52) U.S. Cl.
CPC .. *H01L 21/76897* (2013.01); *H01L 21/28518* (2013.01); *H01L 21/31116* (2013.01); *H01L 21/823418* (2013.01); *H01L 21/823431* (2013.01); *H01L 21/823475* (2013.01); *H01L 23/535* (2013.01); *H01L 27/0886* (2013.01); *H01L 29/0649* (2013.01); *H01L 29/0847* (2013.01); *H01L 21/823425* (2013.01)

(58) Field of Classification Search
CPC ............. H01L 23/535; H01L 21/76897; H01L 21/28518
See application file for complete search history.

(56) References Cited

U.S. PATENT DOCUMENTS

| 7,317,253 B2 * | 1/2008 | Nogami | ............ H01L 21/76808 257/758 |
| 2003/0207561 A1 * | 11/2003 | Dubin | ................... H01L 21/288 438/630 |

(Continued)

*Primary Examiner* — Joseph C. Nicely
*Assistant Examiner* — Lamont B Koo
(74) *Attorney, Agent, or Firm* — Amerson Law Firm, PLLC

(57) ABSTRACT

A method of manufacturing a semiconductor device is provided including forming raised source and drain regions on a semiconductor layer, forming a first insulating layer over the semiconductor layer, forming a first contact to one of the source and drain regions in the first insulating layer, forming a second insulating layer over the first contact, forming a trench in the second insulating layer to expose the first contact, removing a portion of the first contact below the trench, thereby forming a recessed surface of the first contact, removing a portion of the first insulating layer, thereby forming a recess in the trench and exposing a portion of a sidewall of the first contact below the recessed surface of the first contact, and filling the trench and the recess formed in the trench with a contact material to form a second contact in contact with the first contact.

8 Claims, 7 Drawing Sheets

(51) Int. Cl.
    *H01L 29/08*   (2006.01)
    *H01L 23/535*  (2006.01)
    *H01L 29/06*   (2006.01)

(56) References Cited

U.S. PATENT DOCUMENTS

| | | | |
|---|---|---|---|
| 2008/0185645 A1* | 8/2008 | Luo | H01L 29/0847 257/347 |
| 2010/0052178 A1* | 3/2010 | Meinhold | H01L 21/76834 257/773 |
| 2013/0082393 A1* | 4/2013 | Kawamura | H01L 21/76802 257/773 |
| 2013/0316535 A1* | 11/2013 | Shin | H01L 21/28 438/682 |
| 2014/0252440 A1* | 9/2014 | Park | H01L 21/76897 257/296 |
| 2016/0163585 A1* | 6/2016 | Xie | H01L 21/76843 257/368 |

* cited by examiner

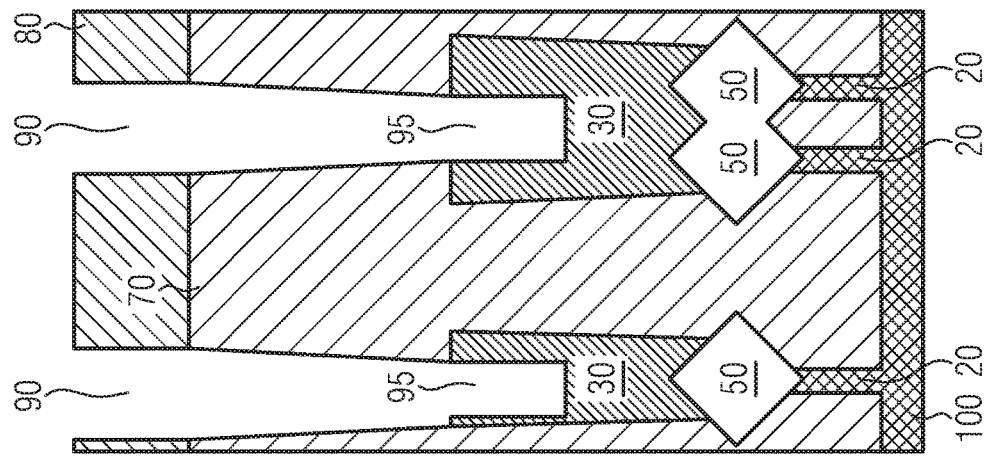
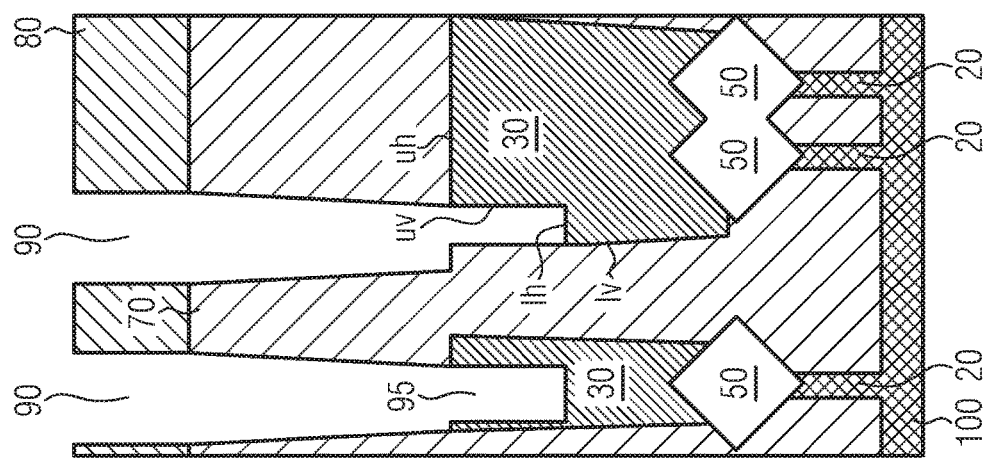
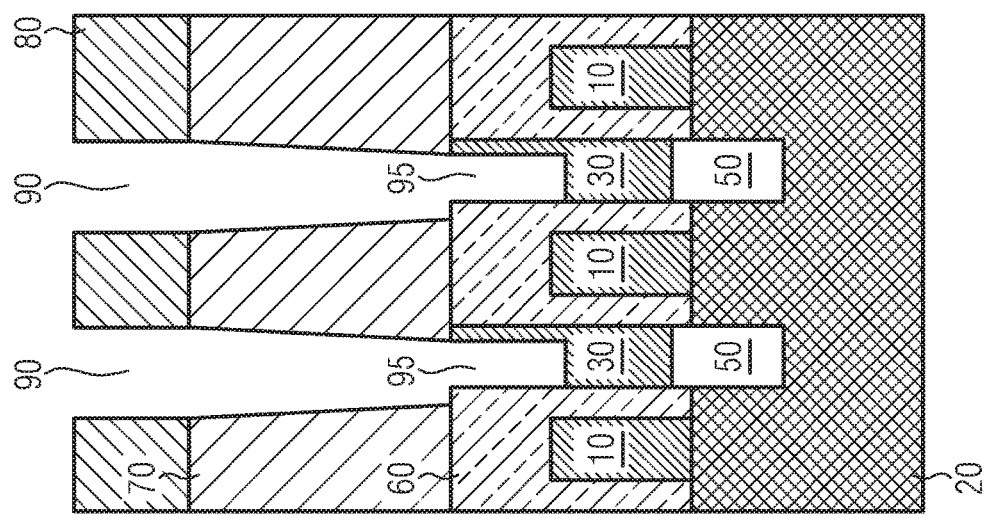
FIG. 2l
FIG. 2k
FIG. 2j

CONTACTING SOURCE AND DRAIN OF A TRANSISTOR DEVICE

BACKGROUND

1. Field of the Disclosure

Generally, the present disclosure relates to the field of integrated circuits and semiconductor devices and, more particularly, to transistor devices and electrical contacts to source and drain regions of such transistor devices.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

Although significant advantages may be obtained with respect to performance and controllability of sophisticated planar transistor architectures, in view of further device scaling, new transistor configurations have been proposed in which a "three-dimensional" architecture may be provided in an attempt to obtain a desired channel width while at the same time maintaining superior controllability of the current flow through the channel region. To this end, so-called FinFETS have been proposed in which a thin sliver or fin of silicon may be formed. Typically, in sophisticated applications, the width of the silicon fins is on the order of 10-20 nm and the height thereof is on the order of 30-40 nm. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure.

Unlike a planar FET, in a FinFET device, a channel is formed perpendicular to a surface of the semiconducting substrate so as to reduce the physical size of the semiconductor device. In a FinFET device, the "channel-width" is approximately two times the vertical fin-height plus the width of the top surface of the fin, i.e., the fin width. Multiple fins can be formed in the same foot-print as that of a planar transistor device. Accordingly, by providing this non-planar transistor architecture, the effective channel width may also be increased so that, for given overall transistor dimensions, an enhanced current drive capability may be accomplished. Additionally, the leakage current of FinFET devices after the device is turned "OFF" is significantly reduced as compared to the leakage current of planar FETs due to the superior gate electrostatic control of the "fin" channel on FinFET devices.

In short, the 3D structure of a FinFET device is a superior MOSFET structure as compared to that of a planar FET, especially in the 20 nm CMOS technology node and beyond.

It is noted that both planar and three-dimensional transistor devices can be formed according to the replacement gate approach or the gate first approach. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HKMG gate structure for the device is formed. Using the gate first technique, on the other hand, involves forming a stack of layers of material across the substrate, wherein the stack of materials includes a high-k gate insulation layer (with a dielectric constant k larger than 5), one or more metal layers, a layer of polysilicon and a protective cap layer, for example, silicon nitride.

Due to the large number of transistor devices in modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers. In order to actually connect the circuit elements fumed in the semiconductor material with the metallization layers, an appropriate vertical contact structure is provided, a first end of which is connected to a respective contact region of a circuit element, such as a gate electrode and/or the drain and source regions of transistors, and a second end that s connected to a respective metal line in the metallization layer. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in some inter-layer dielectric (ILD) material.

In advanced configurations, raised source and drain regions of transistor devices may be contacted by means of combined trench silicide (TS) structures positioned on a gate electrode level and CA contact structures positioned in an insulating layer formed above the gate electrodes and contacting the TS structures.

However, contacting electrodes of transistor devices poses an increasing problem due to the aggressive overall downscaling. For example, relatively high CA-TS contact resistances affect the overall performance characteristics of the FETs. Maintaining the structural integrity during back-end-of-line (BEOL) processing poses a further problem. In addition, the engineers face severe scaling and patterning limitations.

In view of the situation described above, the present disclosure provides techniques of contacting source and drain regions of transistor devices, in particular, FinFET devices and semiconductor devices comprising reliably contacted source and drain regions.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to transistor devices, in particular, FinFET devices. Contacting source and drain regions during the manufacture of transistor devices is particularly addressed herein.

A method of manufacturing a semiconductor device is provided including forming raised source and drain regions on a semiconductor layer (for example, a semiconductor fin formed on a semiconductor bulk substrate or a semiconductor layer of a silicon-on-insulator (SOI) substrate), forming a first insulating layer over the semiconductor layer, forming a first contact (silicide trench structure) to one of the source and drain regions in the first insulating layer, forming a second insulating layer (an interlayer dielectric) over the first contact, forming a trench in the second insulating layer to expose the first contact, removing a portion of the first contact below the trench, thereby forming a recessed surface of the first contact, removing a portion of the first insulating layer, thereby forming a recess in the trench and exposing a portion of a sidewall of the first contact below the recessed surface of the first contact, and filling the trench and the recess formed in the trench with a contact material to form a second contact (CA contact) in contact with the first contact, for example, directly in contact without any interposed material.

Another method of manufacturing a semiconductor device is provided including forming a first semiconductor fin and a second semiconductor fin (both of a FinFET device) on a semiconductor layer (for example, a semiconductor bulk substrate or a semiconductor layer of an SOI substrate), forming a first source or drain region in and on the first semiconductor fin and forming a second source or drain region in and on the second semiconductor fin, forming a first trench silicide structure on the first source or drain region and forming a second trench silicide structure on the second drain or source region, etching the first trench silicide structure to form a stepped first trench silicide structure with an exposed lower horizontal surface and an upper horizontal surface, the lower horizontal surface connecting a lower vertical surface and an upper vertical surface of the stepped first trench silicide structure and etching a trench in the second trench silicide structure, forming a first (CA) contact (for example, directly) on the lower horizontal surface, the upper vertical surface and a portion of the lower vertical surface of the stepped first trench silicide structure and forming a second (CA) contact in the trench of the second trench silicide structure.

Here and in the following, the lower horizontal surface has to be distinguished from a bottom surface of the first trench silicide structure (or first contact). The bottom surface is, in fact, at least partially in contact with the first source or drain region.

A semiconductor device is provided including a semiconductor layer, a raised source or drain region formed on the semiconductor layer, a first stepped contact (stepped silicide trench structure) formed on the source or drain region, the first contact having a lower horizontal surface and an upper horizontal surface, the lower horizontal surface connecting a lower vertical surface and an upper vertical surface of the first contact, and a second (CA) contact formed on the lower horizontal surface of the first contact, the upper vertical surface of the first contact and a portion of the lower vertical surface of the first contact. The semiconductor layer may be a semiconductor fin that is formed on another semiconductor layer of an SOI substrate or on a surface of a semiconductor bulk substrate.

Further, a semiconductor device is provided including a semiconductor substrate, for example, a semiconductor bulk substrate or an SOI substrate comprising a semiconductor bulk substrate, a buried oxide layer formed on the semiconductor bulk substrate and a semiconductor layer formed on the buried oxide layer, a plurality of semiconductor fins formed over the semiconductor substrate (for example, on the semiconductor layer of the SOI substrate) and each comprising raised source and drain regions, a plurality of gates formed over the semiconductor substrate and partially covering the semiconductor fins, an interlayer dielectric formed over the gates, a stepped first contact (stepped silicide trench structure) contacting one of the plurality of the source and drain regions, the first stepped contact comprising a lower horizontal surface, an upper vertical surface and a lower vertical surface, the lower horizontal surface connecting the upper and the lower vertical surfaces with each other, and a second (CA) contact formed in the interlayer dielectric and formed on the lower horizontal surface of the first contact, the upper vertical surface of the first contact and a portion of the lower vertical surface of the first contact.

BRIEF DESCRIPTION OF THE DRAWINGS

The disclosure may be understood by reference to the following description taken in conjunction with the accompanying drawings, in which like reference numerals identify like elements, and in which.

Figure 1:
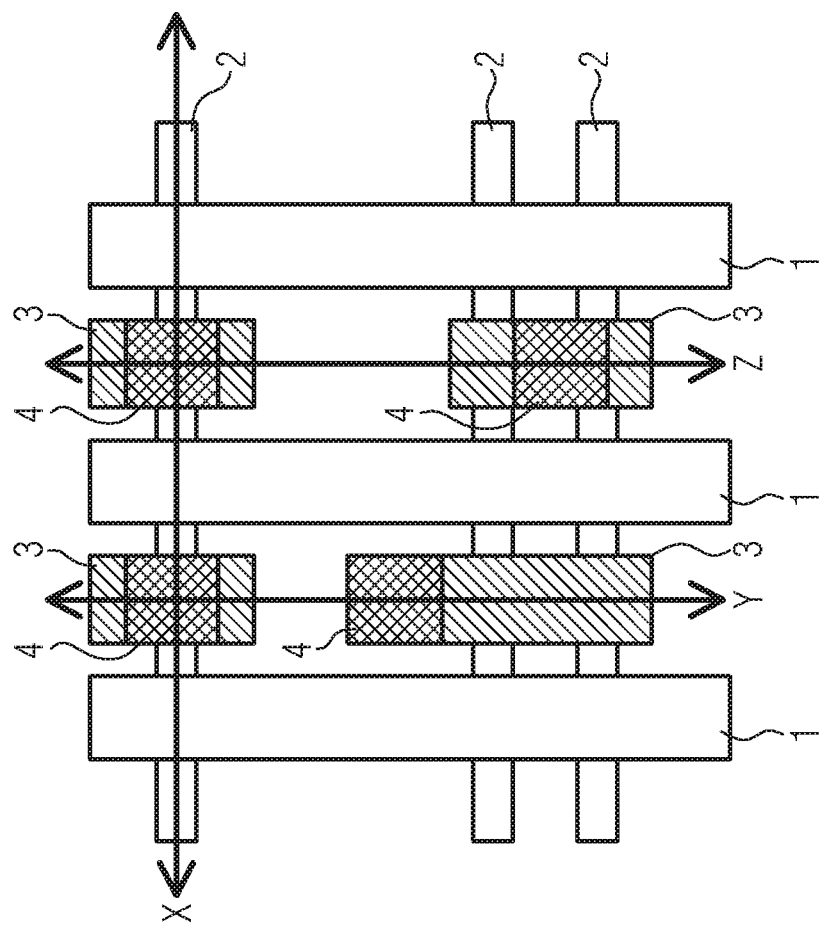
FIG. 1 shows a semiconductor device according to an example of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of FinFETs. These references are intended to be used in a manner consistent with the drawings only for teaching purposes, and are not intended as absolute references for FinFET structures. For example, FinFETs may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be readily apparent to those skilled in the art upon a complete reading of the present application, the present methods are applicable to a variety of technologies, for example, NMOS, PMOS, CMOS, etc., and is readily applicable to a variety of devices, including, but not limited to, logic devices, memory devices and particularly flash memory cells. The manufacturing techniques may be integrated in CMOS manufacturing processes. The techniques and technologies described herein can be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

Figure 2C:
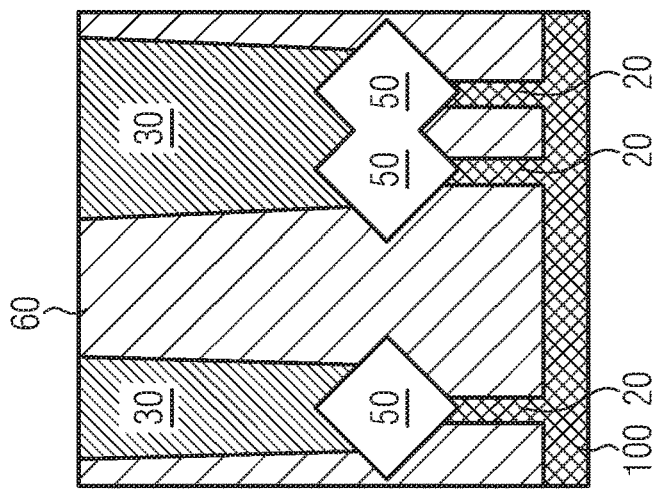
FIGS. 2a-2r Illustrate an exemplary process flow for manufacturing the semiconductor device shown in FIG. 1.
Figure 2B:
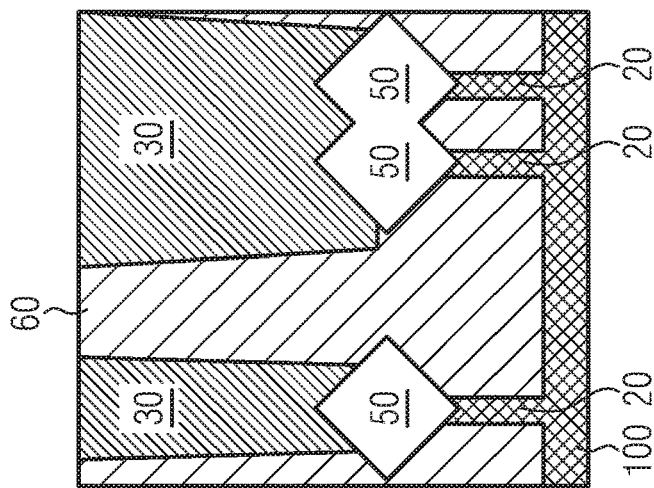
Figure 2A:
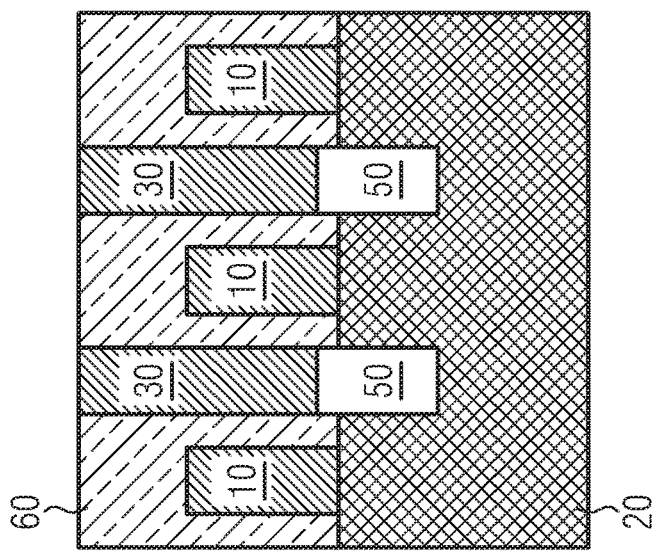

The present disclosure generally provides manufacturing techniques for transistor devices, for example, FinFET devices. Particularly, techniques for contacting raised source and drain regions and transistor devices comprising reliably contacted raised source and drain regions are disclosed. In principle, the disclosed methods can be integrated within the gate first and replacement gate approach as described above. With reference to FIGS. 1 and 2a-2r, illustrative embodiments within the gate first approach will now be described in more detail.

FIG. 1 gives an impression of the semiconductor device that is to be manufactured. The semiconductor device comprises gates 1 of FINFETs and semiconductor fins 2 of the FINFETs. The semiconductor fins 2 are formed on or of a semiconductor material of an underlying semiconductor substrate. In the following, formation of a bulk FinFET is described, for example. However, the semiconductor substrate may alternatively be an SOI substrate comprising a semiconductor bulk substrate, a buried oxide (BOX) layer formed on the semiconductor bulk substrate and a semiconductor layer formed on the buried oxide layer. The thickness of the semiconductor layer may be in the range of 5-20 nm, in particular, 5-10 nm, and the thickness of the BOX layer may be in the range of 10-50 nm, in particular, 10-30 nm. The heights of the semiconductor fins 2 may be in a range of about 20-40 nm, for example.

The gates 1 of FINFETs may comprise polysilicon and they may comprise metal gates. The material of the metal gates depends on whether the transistor device to be formed is a P-channel transistor or an N-channel transistor. In embodiments wherein the transistor device is an N-channel transistor, the metal may include La, LAN or TiN. In embodiments wherein the transistor device is a P-channel transistor, the metal may include Al, AlN or TiN. The gates 1 may, furthermore, comprise high-k gate dielectrics, i.e., high-k metal gates HKMG may be provided. The high-k dielectric material (for example, a dielectric constant k>5 or k>10) may comprise a transitional metal oxide, such as at least one of hafnium oxide, hafnium dioxide and hafnium silicon-oxynitride. A work function adjusting material may be additionally formed over the surfaces of the semiconductor fins 2 and between the semiconductor fins 2 and the gates 1.

The semiconductor substrate may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like.

In an alternative example, wherein an SOI substrate is used, the semiconductor layer above the BOX layer may also comprise silicon. The BOX layer may comprise silicon (di)oxide, for example, borosilicate glass. The BOX layer may be composed of different layers and one of the different layers may comprise borophosphosilicate glass (BPSG) or an $SiO_2$-compound comprising boron. The semiconductor bulk substrate may be a silicon substrate, in particular, a single crystal silicon substrate. Other materials can be used to form the semiconductor substrate such as, for example, germanium, silicon germanium, gallium phosphate, gallium arsenide, etc.

The semiconductor fins 2 may be formed from the semiconductor substrate by appropriate etching. Alternatively, the semiconductor fins 2 may be formed by epitaxial growth. The semiconductor fins 2 may be formed by any suitable combination of lithographic processes that may involve forming a pattern and selectively etching a material. For example, the semiconductor fins 2 may be formed using a double patterning process, e.g., resist-on-resist patterning techniques (which may include a lithography-etch-lithography-etch (LELE) process or a lithography-freeze-lithography-etch (LFLE) process). In other embodiments, the fins may be formed using interferometric lithography, imprint lithography, photolithography, extreme ultraviolet (EUV) lithography, or x-ray lithography. A plurality of semiconductor fins 2 run in parallel in a length direction along a surface of the semiconductor substrate and extend in a height direction perpendicular to the surface of the semiconductor substrate.

It should be appreciated that the semiconductor fins 2 may exhibit an appropriate dopant concentration so as to define corresponding drain and source areas. In addition, channel regions of the FinFET devices may be formed by appropriately doping the respective regions of the semiconductor fins 2.

The semiconductor device shown in FIG. 1 comprises raised source and drain regions formed on the semiconductor fins 2. The raised source and drain regions may be formed by epitaxial growth and are suitably doped. The raised source and drain regions are contacted by trench silicide (TS) structures 3 that in course are contacted by (CA) contact structures 4. The TS structures are formed in an insulating layer (not shown in FIG. 1) that encapsulates the gates 1 and semiconductor fins 2. Moreover, (CB) contacts (not shown in FIG. 1) may be formed for electrically contacting the gates 1.

In the following, it is described how the semiconductor device shown in FIG. 1 can be manufactured. FIG. 2a shows the semiconductor device of FIG. 1 in a particular manufacturing stage in the X-cut indicated in FIG. 1. Accordingly FIGS. 2b and 2c show the corresponding Y-cut and Z-cut, respectively. FIG. 2a shows a semiconductor bulk substrate and a semiconductor fin as indicated by the reference number 20. The semiconductor fin is actually an upper portion of the region 20 and formed of the same material as the underlying semiconductor bulk substrate being a lower portion of the region 20, in the following the semiconductor fins are referenced by the reference number 20, for simplicity. Further, FIG. 2a shows raised source and drain regions 50. The source and drain regions 50 are contacted by TS structures 30. Moreover, gates 10 are formed over the semiconductor fin 20. The TS structures 30 are formed in an insulating layer 60 encapsulating the gates 10 and the semiconductor fin 20. The insulating layer 60 may comprise or be made of an oxide material, for example, silicon dioxide.

Formation of the TS structures 30 may comprise depositing the insulating layer 60 and forming trenches in the insulating layer 60 thereby exposing portions of the underlying source and drain regions. Thereafter, some metal silicide is formed in the trenches built in the insulating layer 60 and, subsequently, tungsten or another suitable material is formed on the metal silicide. The configuration shown in FIGS. 2a, 2b and 2c results after chemical mechanical polishing (CMP). It is noted that the TS structures 30 extend above the top surfaces of the gates 10. It is noted that gate spacers and gate cap materials of the gates 10 may be provided and may be formed of a material different from the one of the insulating layer 60 in order to allow for reactive ion etching for the formation of the trenches of the TS structures self-aligned to the gate structures 10.

The exemplary three semiconductor fins 2 that are shown in FIG. 1 are also shown in the Y-cut illustrated in FIG. 2b and the Z-cut illustrated in FIG. 2c. The semiconductor fins 20 shown in FIGS. 2b and 2c are formed on a semiconductor layer 100. The semiconductor layer 100 may represent a top portion of a semiconductor bulk substrate.

Figure 2F:
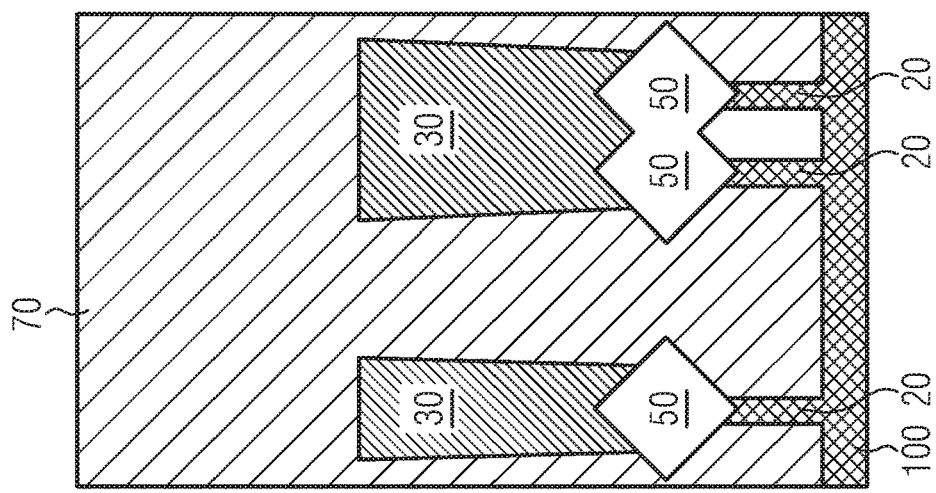
Figure 2E:
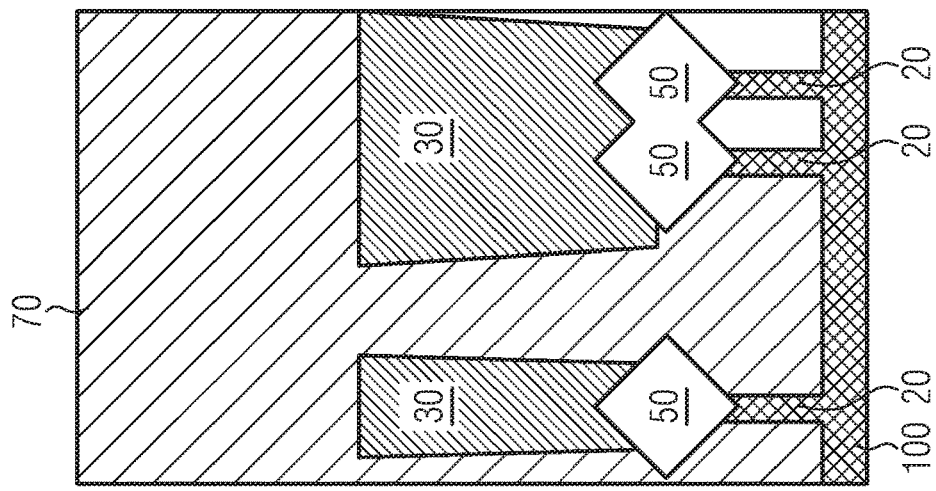
Figure 2D:
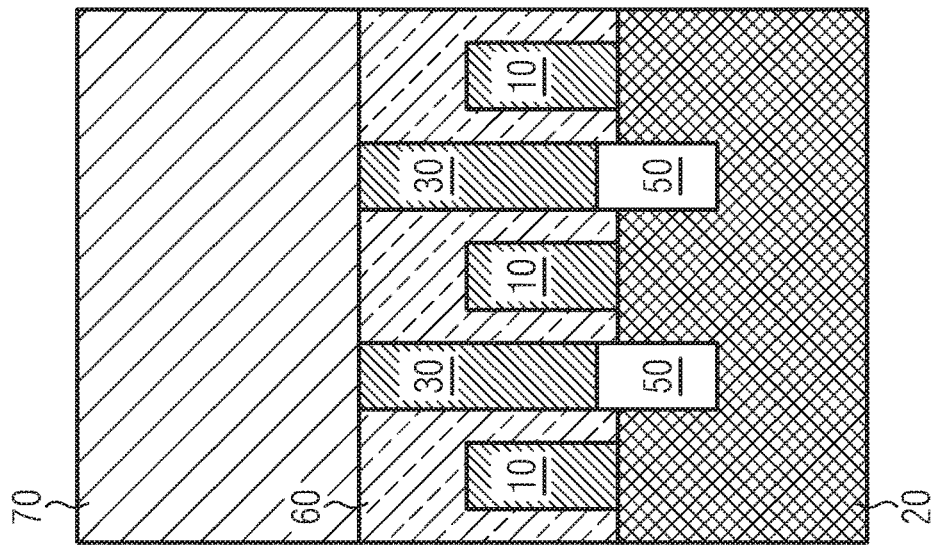

FIG. 2d (X-cut of FIG. 1), FIG. 2e (Y-cut of FIG. 1) and FIG. 2f (Z-cut of FIG. 1) show a manufacturing stage of the semiconductor device shown in FIG. 1 after deposition of an interlayer dielectric (ILD) layer 70 over the structure shown in FIGS. 2a, 2b and 2c. The ILD layer 70 may include a deposited silicon oxide, silicon nitride or silicon oxy-nitride. The ILD layer 70 may be formed by blanket deposition, for example, plasma enhanced chemical vapor deposition (PECVD), a low pressure chemical vapor deposition (LP-CVD) or a chemical vapor deposition (CVD) process. In particular, the ILD layer 70 may be made of the same material as the insulating layer 60. Furthermore, the ILD layer 70 may be a stack layer consisting of multiple layers of different dielectrics, for example, comprising SiN as a bottom layer and $SiO_2$ formed above the bottom layer.

Figure 2I:
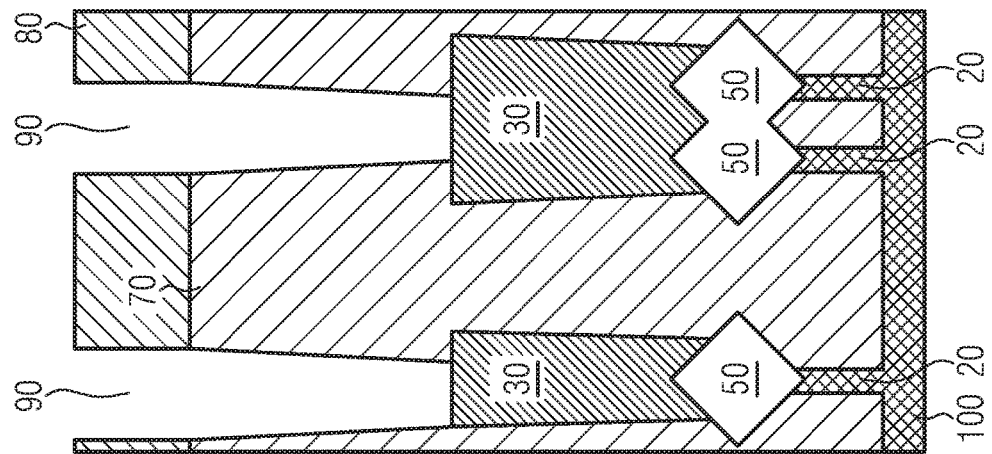
Figure 2H:
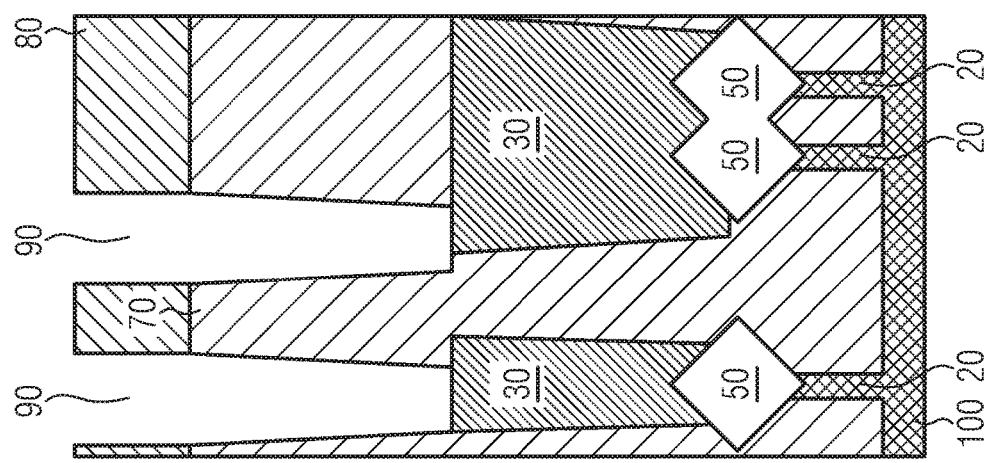
Figure 2G:
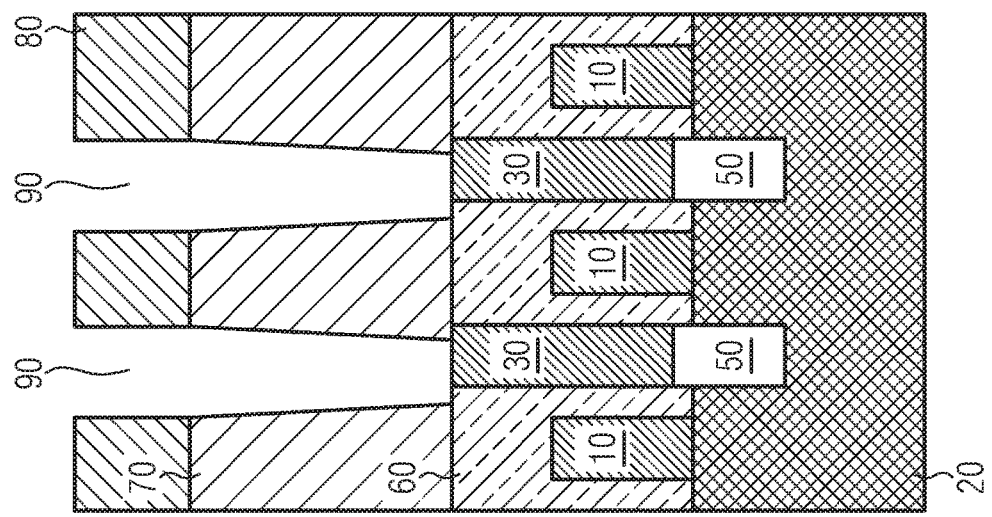

As shown in FIG. 2g (X-cut of Figure FIG. 2h (Y-cut of FIG. 1) and FIG. 2i (Z-cut of FIG. 1), trenches 90 are formed in the HD layer 70 by a first etching process, for example, employing standard lithography employing an organic planarization layer (OPL) 80. For example, a reactive ion etching (RIE) process may be performed in order to form the trenches 90. Reactive ion etching is a dry etch process, wherein ions and radicals are provided by an electric glow discharge that is created in a reactant gas. On the target surface, chemical reactions between the target material and the ions and/or radicals can occur. Additionally, energetic ions may be directed to the target which can cause a sputtering of the surface. Due to the chemical reactions, and due to the sputtering, material can be removed. Selectivity of the reactive ion etch process can be obtained by an appropriate selection of the reactant gas and by an adaptation of parameters such as the pressure of the reactant gas and the power of the electric discharge. The etching process resulting in the trenches 90 as well as further etching processes described below may be facilitated by appropriately formed etch stop layers that are not shown in the Figures. The trenches 90 expose portions of the TS structures 30.

In the manufacturing stage shown in FIG. 2j (X-cut of FIG. 1), FIG. 2k (Y-cut of FIG. 1) and FIG. 2l (Z-cut of FIG. 1), a second etching process, for example, a second RIE process, has been performed to remove portions of the TS structures 30 (by appropriately choosing the reactant gas, etc. for the desired selectivity). Accordingly, recesses 95 are formed through the trenches 90 in the TS structures 30. In particular, one of the TS structures 30 (see FIG. 2k) exhibits a stepped geometric shape comprising an upper horizontal surface uh covered by the ILD layer 70 and an exposed lower horizontal surface lh connected to the upper horizontal surface uh by an upper vertical surface uv. A portion of a lower vertical surface lv below the lower horizontal surface lh will be exposed in the following processing step. This stepped TS structure contacts two source or drain regions 50 of two semiconductor fins 20.

Figure 2O:
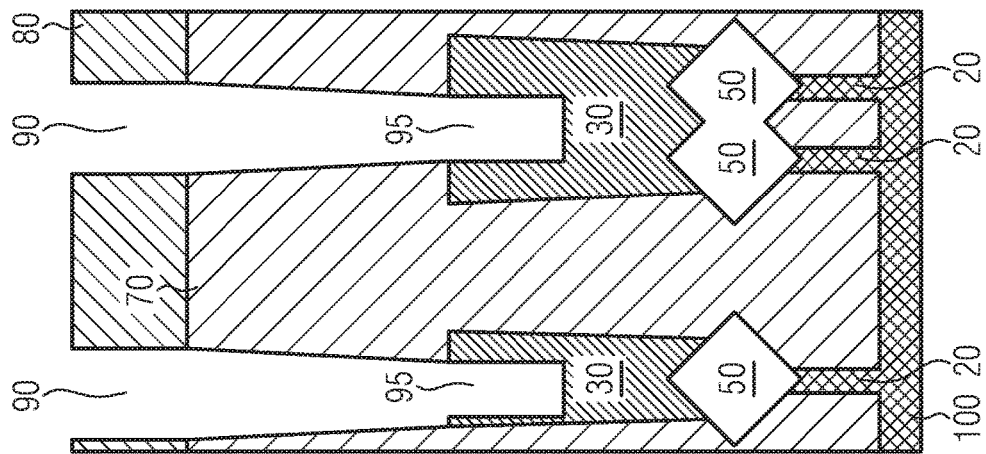
Figure 2N:
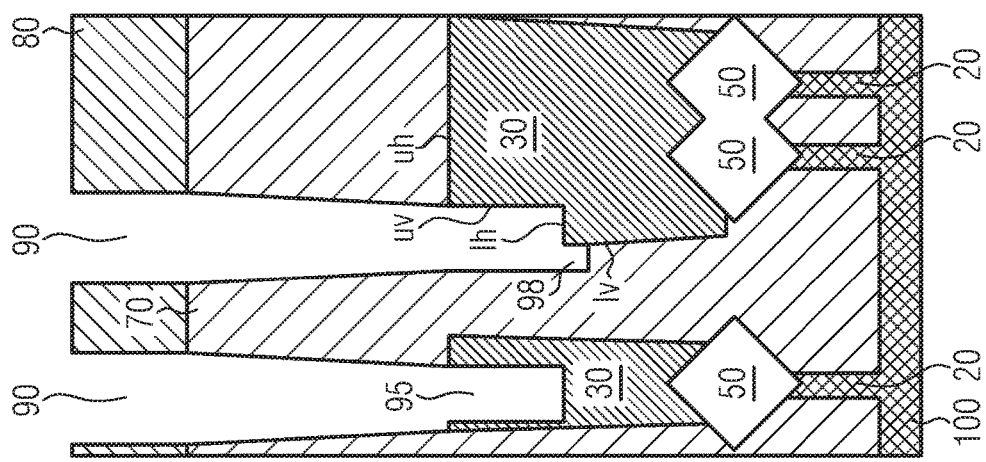
Figure 2M:
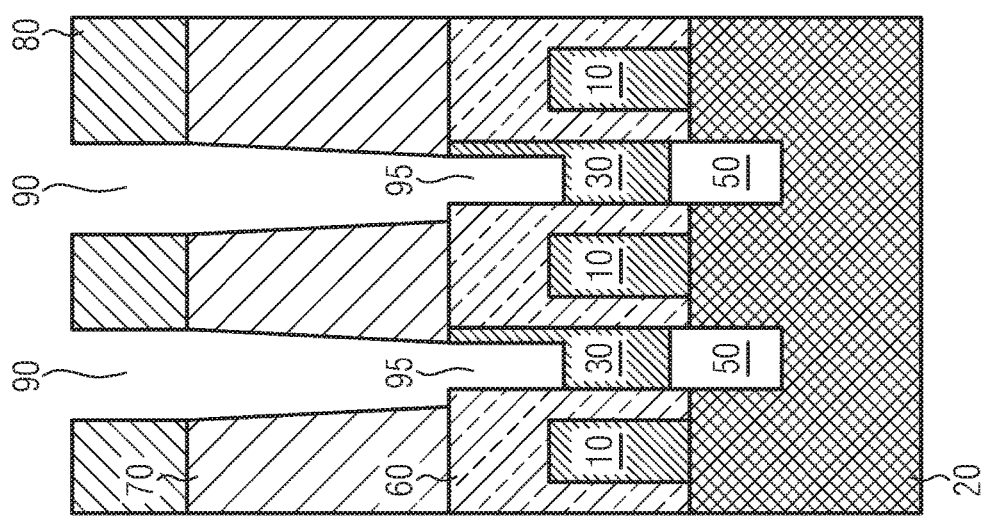
Figure 2R:
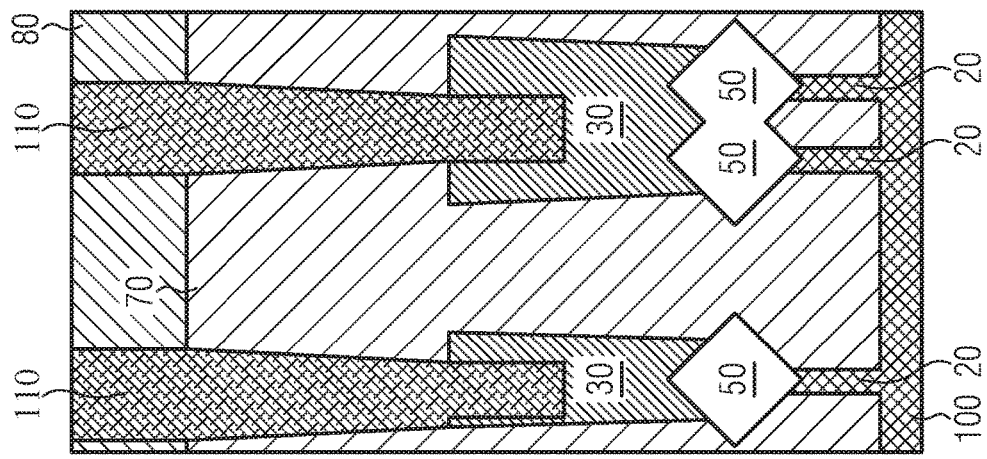

In the manufacturing stage shown in FIG. 2*m* (X-cut of FIG. 1), FIG. 2*n* (Y-cut of FIG. 1) and FIG. 2*o* (Z-cut of FIG. 1), a third etching process, for example, a third RIE process, has been performed. The third etching process removes a portion of the insulating layer 60 selective to the material of the TS structure 30, thereby creating a recess 98 in the insulating layer 60, as can be seen in FIG. 2*n*. Due to that recess, a portion of the lower vertical surface lv of the stepped TS structure shown in FIG. 2*n* is exposed.

Figure 2Q:
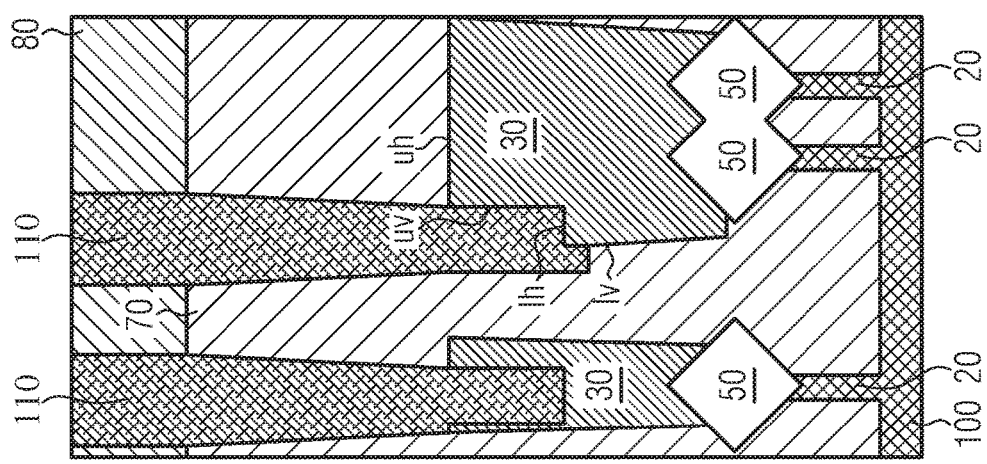
Figure 2P:
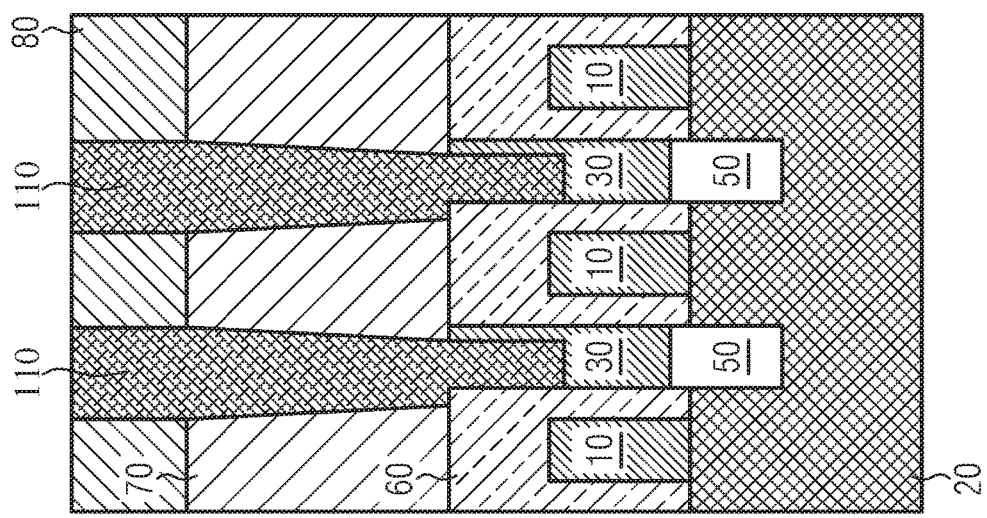

Next, CA contact structures 110 are formed, as illustrated in FIG. 2*p* (X-cut of FIG. 1), FIG. 2*q* (Y-cut of FIG. 1) and FIG. 2*r* (Z-cut of FIG. 1). The CA contact structures 110 are formed by filling the trenches 90, the recesses 95 and the recess 98 (see FIGS. 2*m*, 2*n* and 2*o*, for example) and also exhibit a stepped shape as shown in FIG. 2*q*. In principle, the CA contact structures 110 could be formed by depositing a liner made of Ti or TiN, for example, followed by overfilling the trenches 90 with a conductive material, for example, tungsten, and followed by performing a CMP process to remove excessive material of the CA contact structures 110 and planarize the upper surface of the ILD layer 70. However, there is no need for a liner and the CA contact structures 110 may be formed in direct contact to the respective TS structures 30.

As compared to the art, a very reliable connection between the CA contact structures 110 and the TS structures 30 with an enhanced contact area can be provided. The enhanced contact area is partially due to the overhanging portion of the CA contact structure 110 illustrated in FIG. 2*q* being in contact with the TS structure 30, wherein the overhanging structure results from the recess 98 formed in the insulating layer 60 (see FIG. 2*n*). The CA contact structures 110 are electrically well isolated from the gates 1.

It should be noted that (CB) contacts to the gates 1 may also be formed in the ILD layer 70 and the insulating layer 60. The CB contact structures may be formed by forming trenches in the ILD layer 70 and the insulating layer 60 over the gates 1 and filling the thus formed trenches with a conductive material. For example, the CB contacts to the gates 1 may be formed by depositing a liner made of Ti or TiN in the mentioned trenches and filling the thus prepared trenches with a conductive material, for example, tungsten. The CB contacts are electrically isolated from the raised source and drain regions and the CA contacts and, furthermore, the CB contacts are electrically isolated from each other.

As a result, a semiconductor device is provided herein comprising reliably contacted raised source and drain regions of FETs, wherein the source/drain contacts show a low contact resistance. Methods of manufacturing such a FET, in particular, a FINFET comprising raised source and drain regions formed on semiconductor fins, are also provided herein. The reliable low-resistance contacts are formed during a three-step (reactive ion) etching process. Each of the low-resistance contacts comprises two contact elements in the form of a TS structure and a CA contact.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of manufacturing a semiconductor device, comprising:

forming raised source and drain regions on a semiconductor layer;

forming a first insulating layer over said semiconductor layer;

forming a first contact to one of said raised source and drain regions in said first insulating layer;

forming a second insulating layer over and above said first contact after forming said first contact;

forming a trench in said second insulating layer to remove a portion of said second insulating layer and expose said first contact, wherein said forming of said trench in said second insulating layer comprises a first reactive ion etching;

performing a first etching process through said trench to remove a portion of said first contact exposed below said trench, thereby forming a recessed surface of said first contact lower than an uppermost surface of said first contact, wherein said first etching process comprises a second reactive ion etching;

removing a portion of said first insulating layer exposed by said trench to form a recess in said first insulating layer, said recess exposing a portion of a sidewall of said first contact below said recessed surface of said first contact, wherein said removing of said portion of said first insulating layer comprises a third reactive ion etching; and filling said trench and said recess formed in said trench with a contact material to form a second contact in contact with said first contact.

2. The method of claim 1, wherein said first contact is a trench silicide structure.

3. The method of claim 1, wherein said semiconductor layer is a semiconductor fin of a FinFET.

4. The method of claim 1, wherein said second contact is formed to directly contact said first contact.

5. A method of manufacturing a semiconductor device, comprising:

forming a first semiconductor fin and a second semiconductor fin on a semiconductor layer;

forming a first source or drain region in and on said first semiconductor fin and forming a second source or drain region in and on said second semiconductor fin;

forming a first trench silicide structure on said first source or drain region and forming a second trench silicide structure on said second drain or source region;

etching said first trench silicide structure to form a stepped first trench silicide structure with an exposed lower horizontal surface and an upper horizontal surface connected by an upper vertical surface, said lower horizontal surface connecting a lower vertical surface to said upper vertical surface of said stepped first trench silicide structure, and to etch a trench in said second trench silicide structure; and forming a first contact contacting said lower horizontal surface, said upper vertical surface and a portion of said lower vertical surface of said stepped first trench silicide structure and forming a second contact in said trench of said second trench silicide structure.

6. The method of claim 5, wherein said first contact directly contacts said lower horizontal surface, said upper vertical surface and said portion of said lower vertical surface of said stepped first trench silicide structure and further comprising forming a liner in said trench of said second silicide trench structure before forming said second contact in said trench of said second trench silicide structure.

7. The method of claim 5, further comprising forming a first insulating layer over said first source or drain region and said second source or drain region and wherein said first and second silicide trench structures are formed in said first insulating layer and further comprising removing a portion of said first insulating layer to expose a portion of said lower vertical surface of said stepped first trench silicide structure before forming said first contact.

8. The method of claim 7, further comprising forming a second insulating layer over said first insulating layer and forming a first trench in said second insulating layer over said first silicide trench structure and forming a second trench in said second insulating layer over said second trench structure before forming said first and second contacts.

* * * * *